United States Patent [19]

Satou et al.

[11] 4,152,717
[45] May 1, 1979

[54] COMPLEMENTARY MOSFET DEVICE

[75] Inventors: Kazuo Satou, Yokohama; Mitsuhiko Ueno, Fujisawa, both of Japan

[73] Assignee: Tokyo Shibaura Electric Co., Ltd., Japan

[21] Appl. No.: 917,175

[22] Filed: Jun. 20, 1978

Related U.S. Application Data

[63] Continuation of Ser. No. 706,126, Jul. 16, 1976, abandoned.

[30] Foreign Application Priority Data

Jul. 18, 1975 [JP] Japan .................................. 50-87397

[51] Int. Cl.² .......................................... H01L 27/02
[52] U.S. Cl. .......................... 357/42; 357/23; 357/86
[58] Field of Search ........................... 357/23, 42, 86

[56] References Cited

U.S. PATENT DOCUMENTS 3,641,511  2/1972  Cricchi et al. ........................... 357/42
3,967,295  6/1976  Stewart .................................... 357/42

Primary Examiner—Edward J. Wojciechowicz
Attorney, Agent, or Firm—Finnegan, Henderson, Farabow and Garrett

[57] ABSTRACT

A CMOS FET device having a P well layer diffused in an N type semiconductor substrate, a P channel MOS transistor formed on the N type semiconductor substrate, and an N channel MOS transistor provided in the P well layer, wherein the source of the P channel MOS transistor is made to have the same potential as the N type semiconductor substrate and for the source of the N channel MOS transistor is made to have the same potential as the P well layer, thereby suppressing the operation of a parasitic bipolar transistor whose base is constituted by the N type semiconductor substrate and/or a parasitic bipolar transistor whose base is formed of the P well layer.

4 Claims, 11 Drawing Figures

F I G. 2
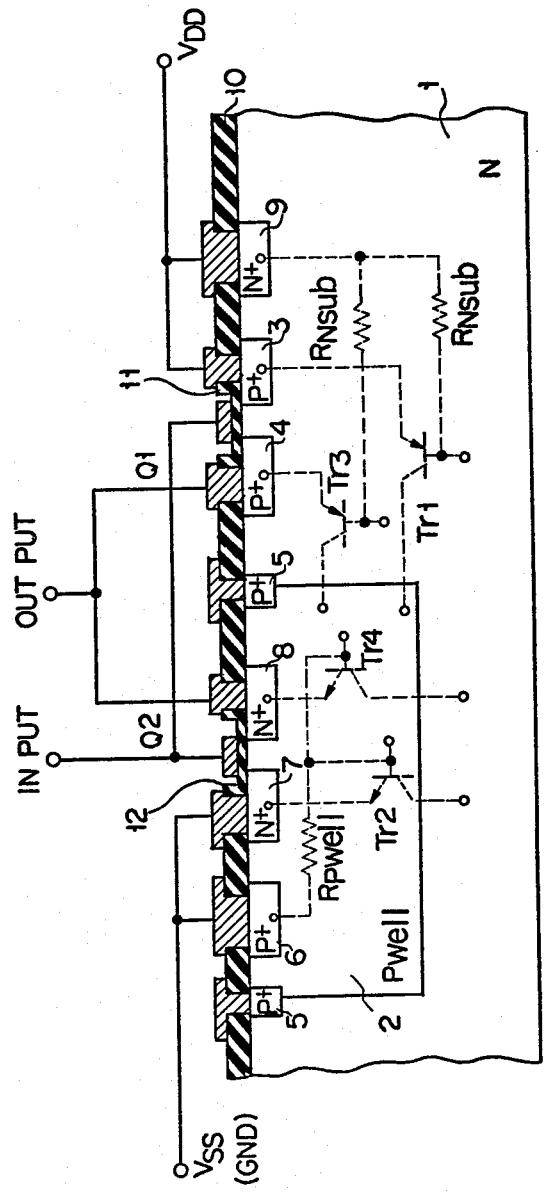

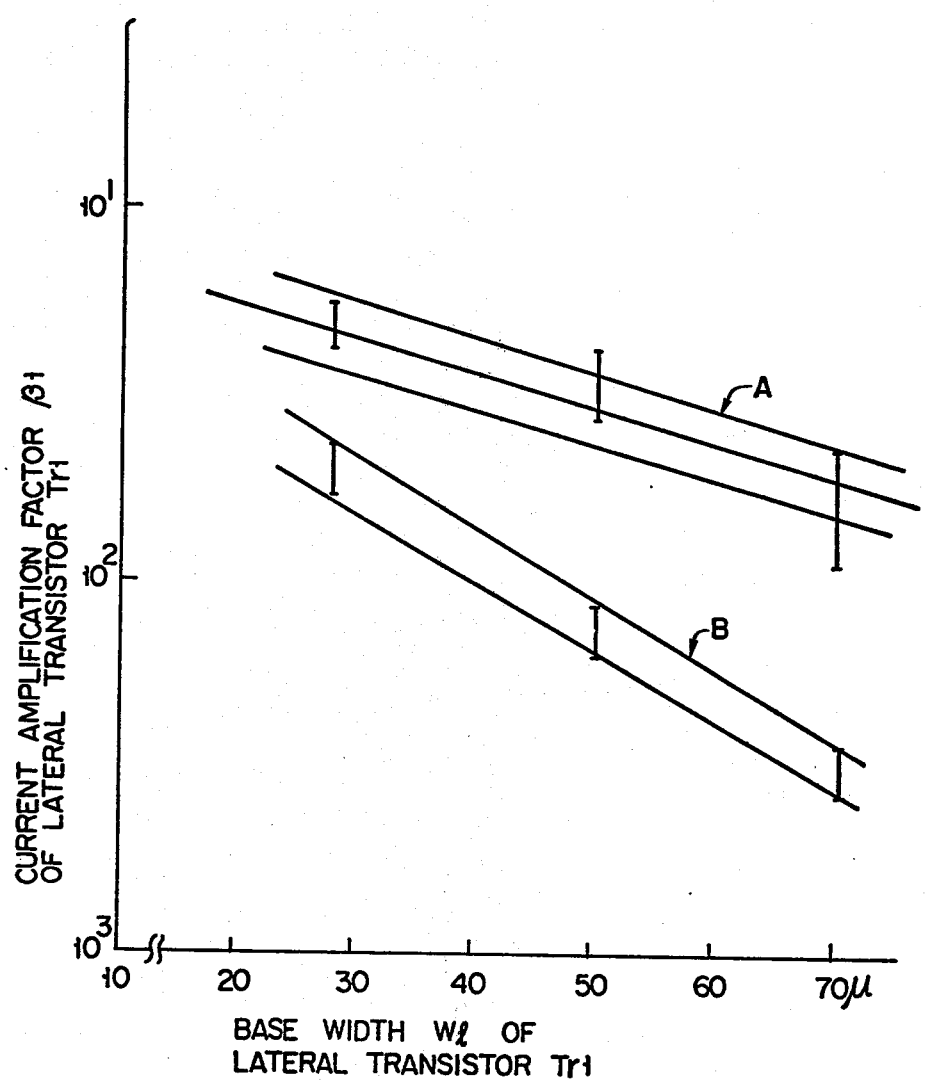

COMPLEMENTARY MOSFET DEVICE

This is a continuation, of application Ser. No. 706,126, filed July 16, 1976 now abandoned.

This invention relates to a complementary MOSFET (hereinafter called CMOS) device in which an operation of parasitic bipolar transistors is suppressed.

Hitherto various circuits constituted by CMOS's have been known. A typical example is a CMOS inverter circuit. As well known, a CMOS inverter circuit is constituted by a p-channel MOS transistor and an n-channel MOS transistor. The threshold voltage of one of these MOS transistors has the opposite characteristics to that of the other MOS transistor. For this reason, generally only one of the two MOS transistors is switched on in response to input information. Thus no current flows between the power source of the CMOS inverter circuit, except during the transient period of the input information pulse. Thus, almost no operation power needs to be consumed, except that during the transient period of the pulse, both MOS transistors are switched on but for a moment, thereby causing only a transient current for a moment, that a leak current occurs at the PN junction, and that a current flows due to charge or discharge of a storage capacitor at the output terminal of the CMOS inverter circuit.

However, when noise is applied impulsively to the output or input of such a CMOS circuit system, an abnormally large DC current of tens of mA to hundreds of mA flows between the positive and negative power sources of the CMOS circuit. Even after removing the noise, such abnormal current is observed to keep flowing regularly. This regular flow of the abnormally large current sometimes causes the CMOS circuit connection to be melt and thus cut. The impulse corresponding to the noise has both polarities, positive and negative, and serves to generate an abnormal current. To remove this abnormal current it is necessary either to lower the power source voltage below a specific value or to disconnect the CMOS circuit system from the power source.

Accordingly, an object of the invention is to provide a CMOS device in which an abnormally large current is prevented from being generated by impulse noise and thus from flowing.

Another object of the invention is to provide a CMOS device in which the circuit connection is never melted nor and cut even if impulse noise is applied.

Still another object of the invention is to provide a CMOS device which can keep operating with a low power consumption even if an impulse noise signal is applied.

According to the present invention, there is provided a CMOS FET device having a semiconductor substrate of one conductivity type, a well layer of the opposite conductivity type formed in the substrate, a first MOS transistor of one channel type formed in the substrate and a second MOS transistor of the opposite channel type formed in the well layer wherein the source of the first MOS transistor is made to have the same potential as the substrate and/or the source of the second MOS transistor is made to have the same potential as the well layer, thereby suppressing the operation of a parasitic bipolar transistor whose base is constituted by the substrate and/or a parasitic bipolar transistor whose base is formed of the well layer. The operation of the bipolar transistor may be suppressed by controlling a distance from the edge of at least one contact hole on the surface of a contact region formed in the substrate or well layer to the boundary edge between the substrate and the well layer. The present invention is applied to the CMOS device wherein the product of the parasitic bipolar transistors is more than 1.

This invention can be more fully understood from the following detailed description when taken in conjunction with the accompanying drawings, in which:

FIG. 2 is a cross-sectional side view of one embodiment of the semiconductor device to explain the present invention;

FIG. 4 is a diagram indicating the dependence of the current amplification factor of a lateral transistor having an N substrate as its base on the base width thereof;

The invention shall now be explained in detail with reference to the accompanying drawings.

Figure 1:
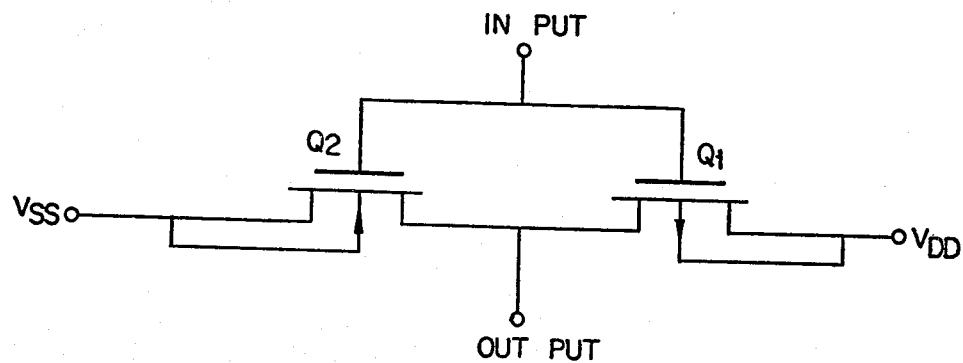
FIG. 1 is a circuit diagram of an inverter constituted by CMOS's.

The CMOS inverter circuit illustrated in FIG. 1 is comprised of a p-channel MOS transistor $Q_1$ and n-channel MOS transistor $Q_2$. The source electrode of the MOS transistor $Q_1$ is connected to the positive power source $V_{DD}$, while the drain electrode thereof is connected to the output terminal, jointly with the drain electrode of the MOS transistor $Q_2$. The source electrode of the MOS transistor $Q_2$ is connected to the negative power source $V_{SS}$. The gate electrodes of the MOS transistors $Q_1$ and $Q_2$ are coupled to each other so as to form the input terminal of the CMOS inverter circuit.

FIG. 2 shows one embodiment of the semiconductor device according to the invention, wherein the CMOS inverter circuit shown in FIG. 1 is formed in a semiconductor wafer. The substrate 1 of the embodiment is an N type silicon substrate with an N type impurity, for example phosphorus, doped in concentration of about $1 \times 10^{15}$ atoms/cm$^3$. From the surface of the N type silicon substrate 1 a P type impurity, for example boron, is diffused into a portion of the substrate 1 in concentration of about $2 \times 10^{16}$ atoms/cm$^3$, thereby forming a P well layer 2. Further, boron is diffused into the N type substrate 1, the P well layer 2 and the junction edges between the N type substrate 1 and the P well layer 2, in concentration of about $10^{19}$ atoms/cm$^3$, thereby simultaneously forming in the N type substrate 1 a P+ type source region 3 and a P+ type drain region 4 which constitute a p-channel MOS transistor $Q_1$, a P+ type conductive coupling region 6 in the P well layer, and P+ type guard rings 5 in the junction edges between N type substrate 1 and the P well layer 2. Therefore, phosphorus is diffused into the P well layer 2 and the N type substrate 1 in concentration of about $10^{20}$ atoms/cm$^3$, thereby forming simultaneously an N+ type source region 7 and an N+ type drain region 8 which constitute an n-channel MOS transistor $Q_2$ in the P well layer 2 and an N+ type conductive coupling region 9 in the N type substrate 1. This done, the field silicon oxide 10 is formed on the entire surface of the substrate 1.

Thereafter, in order to form gate regions of the MOS transistors $Q_1$ and $Q_2$, photo-etching is conducted on the substrate 1, thereby making holes in the field oxide film 10. At the bottoms of these holes gate oxide films 11 and 12 having a thickness of 1500Å are formed by oxidizing the holes at a high temperature. Then in order to effect such a circuit connection as shown in FIG. 1, contact holes of predetermined sizes are bored in the silicon oxide film 10, and a conductive film of, for example, aluminum is deposited all over the surface of the substrate 1. The conductive film is then cut in a specific pattern so as to connect the P+ type drain region 4 and the N+ type drain region 8 to each other and connect the gate regions (or oxide films) 11 and 12 to each other. Thus, the drain regions 4 and 8 form an output terminal, and the gate regions 11 and 12 an input terminal. At the same time the P+ type conductive coupling region 6 and the N+ type conductive coupling region 9 are connected to the negative power source $V_{SS}$ (ground) and the positive power source $V_{DD}$, respectively. Further, if necessary, a silicon oxide film may be laid by chemical epitaxial growth on the entire surface, except for desired portions, of the aluminum conductive film so as to protect the aluminum conductive film and enhance the reliability of the semiconductor device. Though not shown in FIG. 2, a stopper may be disposed between the MOS transistors $Q_1$ and $Q_2$.

When noise is applied impulsively to the output or input of the semiconductor device which is so constituted as mentioned above and which serves as a CMOS inverter circuit, an abnormal current of 10 mA to 100 mA does flow. The inventors of the present invention have closely observed and studied this phenomenon. Finally the inventors have found out that when an impulse noise current is applied to the semiconductor device, a specific thyristor circuit is formed in the semiconductor device, as depicted by dotted lines in FIG. 2. Namely, four kinds of parasitic bipolar transistors are formed in the semiconductor substrate 1. More specifically, a PNP lateral transistor $Tr_1$, whose emitter, base and collector are the source region 3 of the p-channel MOS transistor $Q_1$, the N type semiconductor substrate 1 and the P well layer 2, respectively, is formed in the direction parallel to the surface of the substrate 1. An NPN vertical transistor $Tr_2$, whose emitter, base and collector are the N+ type source region 7 of the n-channel MOS transistor $Q_2$, the P well layer 2 and the N type semiconductor substrate 1, respectively, is formed in the direction perpendicular to the surface of the substrate 1. Similarly, a PNP lateral transistor $Tr_3$, whose emitter, base and collector are the P+ type drain region 4 of the p-channel MOS transistor $Q_1$, the N type semiconductor substrate 1 and the P well layer 2, respectively, is formed in the direction parallel to the surface of the substrate 1. And an NPN vertical transistor $Tr_4$, whose emitter, base and collector are the N+ type drain region 8 of the n-channel MOS transistor $Q_2$, the P well layer 2 and the N type semiconductor substrate 1, respectively, is formed in the direction perpendicular to the surface of the substrate 1.

In the semiconductor device shown in FIG. 2 the collectors of the lateral transistors $Tr_1$ and $Tr_3$ and the bases of the vertical transistors $Tr_2$ and $Tr_4$ are constituted commonly by the P well layer 2. Thus, they are connected to one another and to the negative power source $V_{SS}$ (that is, grounded) through a resistance $R_{Pwell}$ and the P+ type conductive coupling region 6 both formed in the P well layer 2. On the other hand, the bases of the lateral transistors $Tr_1$ and $Tr_3$ and the collectors of the vertical transistors $Tr_2$ and $Tr_4$ are constituted commonly by the semiconductor substrate 1. They are therefore connected together and to the positive power source $V_{DD}$ through a resistance $R_{Nsub}$ and the N+ type conductive coupling region 9 both formed in the semiconductor substrate 1. Further, the emitters of the transistors $Tr_3$ and $Tr_4$ are connected to the output terminal OUTPUT, and the emitters of the transistors $Tr_1$ and $Tr_2$ are connected to the positive power source $V_{DD}$ and the negative power source $V_{SS}$, respectively.

Figure 3:
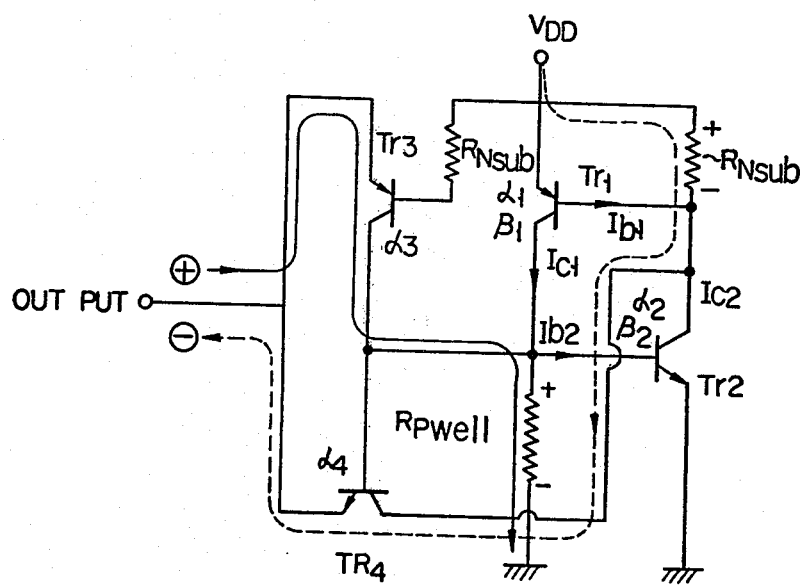
FIG. 3 shows an equivalent circuit diagram to a thyristor circuit in the form of a CMOS circuit semiconductor device.

The connection of the lateral and vertical transistors being as such, the thyristor circuit formed in the CMOS circuit device of FIG. 2 and indicated in dotted lines in FIG. 2 can be expressed as such an equivalent circuit as illustrated in FIG. 3. With reference to FIG. 3, it shall be explained how the thyristor formed in the CMOS circuit device shown in FIG. 2 operates. In the following explanation, "$\alpha$" denotes a current amplification factor which is a bipolar transistor term generally employed to mean the ratio of collector current to the emitter current, "$\beta$" a current amplification factor, i.e. the ratio of the collector current to the base current ($\beta = \alpha/1-\alpha$), and "I" current. Similarly, "e", "b" and "c" stand for emitter, base and collector, respectively, and employed as suffix signs. Further, suffix numerals are used thereby to denote the transistors indicated by the corresponding numerals. In addition "r" is employed to denote the internal resistance of each transistor.

In FIG. 3, when a positive impulse noise current $I_{in}$ is applied to the output terminal as shown by the solid arrow, current of $\alpha_3 \times I_{in}$ flows in the collector of the transistor $Tr_3$. The current of $\alpha_3 \times I_{in}$ then flows through the resistance $R_{Pwell}$ of the P well layer 2, which serves as a by-pass. When the voltage across the resistance becomes over the threshold voltage $V_{bc2}$ between the base and emitter of the transistor $Tr_2$, the transistor $Tr_2$ is rendered conductive, and base current $I_{b2}$ flows through its base. The resistance $R_{Pwell}$ in the P well layer is far greater than the internal resistance rbe2 between the base and emitter of the transistor $Tr_2$. For this reason, the collector current $\alpha_3 \times I_{in}$ of the transistor $Tr_3$ hardly flows through the resistance $R_{Pwell}$. Consequently, the base current $I_{b2}$ of the transistor $Tr_2$ is almost equal to the collector current $\alpha_3 \times I_{in}$ of the transistor $Tr_3$. Namely, $$I_{b2} \simeq \alpha_3 I_{in} \quad (R_{Pwell} >> rbe2) \tag{1}$$

$$I_{c2} = \beta_2 I_{b2} = \beta_2 \alpha_3 I_{in} \tag{2}$$

Similarly, when the collector current $I_{c2}$ of the transistor $Tr_2$ acts as drive current and the voltage at both terminals of the resistance $R_{Nsub}$ of the substrate rises to the threshold voltage $V_{be1}$ between the base and emitter of the transistor $Tr_1$, the transistor $Tr_1$ is rendered conductive. Thus a base current $I_{b1}$ flows through the base of the transistor $Tr_1$. The base current $I_{b1}$ is nearly equal to the collector current $I_{c2}$ of the transistor $Tr_2$ since the resistance of $R_{Nsub}$ is extremely greater than the internal resistance rbe1 between the base and emitter of the transistor $Tr_1$. That is, $$I_{b1} \approx I_{c2} \ (R_{Nsub} >> rbe1) \tag{3}$$

$$I_{c1} = \beta_1 I_{b1} = \beta_1 I_{c2} = \beta_1 \beta_2 \alpha_3 I_{in} \tag{4}$$

When the MOS transistors $Tr_1$ and $Tr_2$ are made conductive, current flows between the positive power source $V_{DD}$ and the ground through these transistors $Tr_1$ and $Tr_2$. In other words, when an impulse noise is applied to the CMOS inverter circuit, an abnormal current flows between the positive power source $V_{DD}$ and the ground through the semiconductor substrate 1 and the P well layer 2.

To keep a current flow between the positive power source $V_{DD}$ and the ground even after the noise application is stopped, it is required that the loop circuit constituted by the transistors $Tr_1$ and $Tr_2$ should perform a positive feedback operation. This is achieved only if the base current $I_{b2}$ of the transistor $Tr_2$ which is rendered conductive first when the impulse noise is applied is made equal to or smaller than the collector current $I_{c1}$ of the transistor $Tr_1$ which is rendered conductive after the transistor $Tr_2$. That is, $$I_{b2} \leqq I_{c1} \tag{5}$$

Namely, $$I_{b2} = \alpha_3 I_{in} \leqq \beta_1 \beta_2 \alpha_3 I_{in}.$$

Therefore, $$1 \leqq \beta_1 \beta_2$$

...(6)

From formula (6) it is understood that when the product of the current amplification factors $\beta_1$ and $\beta_2$ of the transistors $Tr_1$ and $Tr_2$ is equal to or larger than 1, an abnormal current keeps flowing between the positive power source $V_{DD}$ and the ground of the CMOS inverter circuit.

So long as the product of $\beta_1$ and $\beta_2$ is larger than 1, in the loop circuit including the transistors $Tr_1$ and $Tr_2$ the base current $I_{b2}$ in a specific cyclic period becomes greater than the base current $I_{b2}$ in the preceding cyclic period. Thus, the more times the current flows cyclically in the loop circuit, the greater the current between the power source $V_{DD}$ and the ground becomes. But the current does not increase indefinitely. The current amplification factor $\beta$ of a transistor is a function to current, and its value increases with the current. However, it starts growing smaller one when it has reached a maximum value, $\beta$ max. For this reason, the abnormal current flowing between the positive power source $V_{DD}$ and the ground of the CMOS inverter circuit is eventually maintained at a specific value, i.e. point of balance between the current increase effected by the loop circuit and the current decrease achieved by the reduction of current amplification factor. Namely, usually the abnormal current comes to have such a value as is defined when the following two conditions are satisfied at the same time:

a. $I_{b2}(n-1) = I_{b2}(n)$ b. $\beta_1(n) \cdot \beta_2(n) \geqq 1$, where "n" denotes the number of cyclic periods during which the abnormal current flows in the loop circuit.

The size of a transistor does not make a primary factor of the possibility of an abnormal current flow. But when the current amplification factor $\beta$ of the transistor was measured with the size of the transistor (strictly speaking, the drain area) as parameter, it was ascertained that there existed an interrelationship between the size of the transistor and the current value at which the abnormal current was finally maintained. This fact indicates that the larger is the drain area of a transistor, the greater is the abnormal current.

When a negative impulse noise is applied to the output of the CMOS inverter circuit as shown in FIG. 3, such current as indicated by the dotted-line arrow flows between the positive power source $V_{DD}$ and the output terminal OUTPUT, and the following formulas are established similarly as in case a positive impulse noise is applied to the output terminal:

$$I_{b1} \approx \alpha_4 I_{in} \ (R_{Nsub} \geqq re1) \tag{7}$$

$$I_{c1} = \beta_1 I_{b1} = \beta_1 \alpha_4 I_{in}$$

$$I_{b2} = I_{c1} \ (R_{Pwell} >> rbe2) \text{ and}$$

$$I_{c2} = \beta_2 I_{b2} = \beta_2 \beta_1 I_{b1} = \beta_1 \beta_2 \alpha_4 I_{in}$$

To maintain current in the circuit constituted by the transistors $Tr_1$ and $Tr_2$ it is required that the collector current $I_{c2}$ of the transistor $Tr_2$ which is rendered conductive after the transistor $Tr_1$ should be greater than the base current $I_{b1}$ of the transistor $Tr_1$. That is, $$I_{b1} \leqq I_{c2} \tag{8}$$

In order to maintain an abnormal current in the CMOS inverter circuit in case a negative noise is applied thereto, it is required as in case a positive noise is applied that the following formula be established:

$$1 \leqq \beta_1 \beta_2 \tag{6}$$

Thus it is ascertained that to avoid generation of an abnormal current and perpetual flow of the same in such a thyristor circuit as illustrated in FIGS. 2 and 3 it is sufficient to keep smaller than 1 the products of the current amplification factors $\beta_1$ and $\beta_2$ of the transistors $Tr_1$ and $Tr_2$. To generalize it, in order to prevent generation of an abnormal current and a perpetual flow thereof in a CMOS inverter due to the operation of a thyristor circuit, it is sufficient to hold less than 1 the product of the current amplification factors $\beta$ of a lateral transistor formed substantially in parallel to the surface of the semiconductor substrate and a vertical transistor formed perpendicular to the surface of the semiconductor substrate.

The inventors of the present invention have found that to satisfy this requirement in practice, the following measures are effective:

(1) To increase the base width of one or both of the lateral and vertical transistors.

(2) To conduct a heat treatment on the semiconductor substrate during the manufacture process, thereby to shorten the life time of the carrier in the substrate.

(3) To shorten the life time of the carrier in the semiconductor wafer of which the substrate is formed.

(4) To dope the semiconductor substrate with gold.

Four embodiments (1) to (4) of the invention shall be explained, in which the above-noted measures (1) to (4) are taken, respectively.

EMBODIMENT (1)

In the diagram of FIG. 4, plotted on the axis of ordinate is the current amplification factor $\beta_1$ of the lateral transistor $Tr_1$. In logarithmic notation, and plotted on the axis of abscissa is the base width $W_l(\mu)$ of the lateral transistor $Tr_1$, i.e. the distance between the edge of the P well layer 2 and the edge of the source region 3 of the p-channel MOS transistor $Q_1$ formed in the portion of the semiconductor substrate 1 other than the P well layer 2. The diagram shows that as the base width $W_l$ increases, the current amplification factor $\beta_1$ becomes smaller. The length of each vertical line in FIG. 4 indicates the range within which the current amplification factor $\beta_1$ varies according to individual wafers and the position within the same wafer when the factor is measured, though the base width $W_l$ is one and the same.

Figure 5:
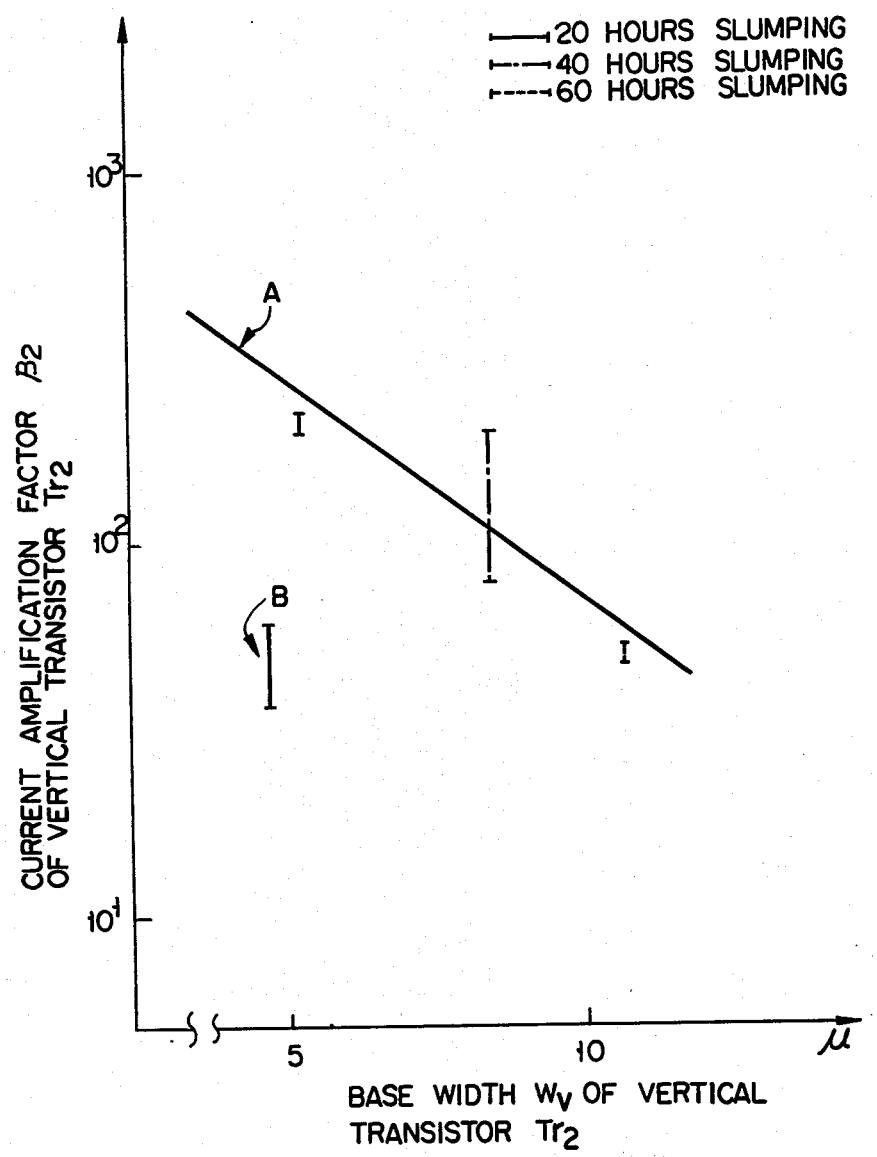
FIG. 5 is a diagram indicating the dependence of the current amplification factor of a vertical transistor having a P well layer as its base on the base width thereof.

In the diagram of FIG. 5, plotted on the axis of ordinate is the current amplification factor $\beta_2$ of the vertical transistor $Tr_2$ in logarithmic notation, and plotted on the axis of abscissa is the base width $W_v(\mu)$ of the vertical transistor $Tr_2$, i.e. the thickness of the P well layer 2 minus the thickness of the source region 7 of the n-channel MOS transistor $Q_2$ formed in the P well layer 2. This diagram teaches that as the base width $W_v$ increases, the current amplification factor $\beta_2$ becomes smaller. In FIG. 5 the length of each vertical line indicates the range within which the current amplification factor $\beta_2$ varies according to individual wafers and the position within the same wafer where the factor is measured, though the base width $W_v$ is the same. The length of vertical lines further incidate the variation of the current amplification factor $\beta_2$ when the doping amount of impurities is so regulated that the impurity concentration may become the same in case the slumping time, i.e. the period during which the wafer undergoes a heat treatment, varies as 20 hours, 40 hours and 60 hours, respectively, thereby causing a change of the base width $W_v$ of the vertical transistor $Tr_2$. Since the base width $W_v$ of the vertical transistor $Tr_2$ much depends on the thickness of the P well layer 2, it is influenced by the variation of the slumping time.

The relationship between the base width and the current amplification factor of the lateral or vertical transistor differs since the current amplification factors $\beta_1$ and $\beta_2$ varies according to the process of manufacturing the semiconductor device. For this reason, the straight lines A and B which show the relationship obtained from different experiments A and B using different semiconductor devices incline at different angles as shown in FIGS. 4 and 5. In FIG. 5, no other current amplification factor of the vertical transistor $Tr_2$ than indicated by the line B could not be measured.

Figure 6:
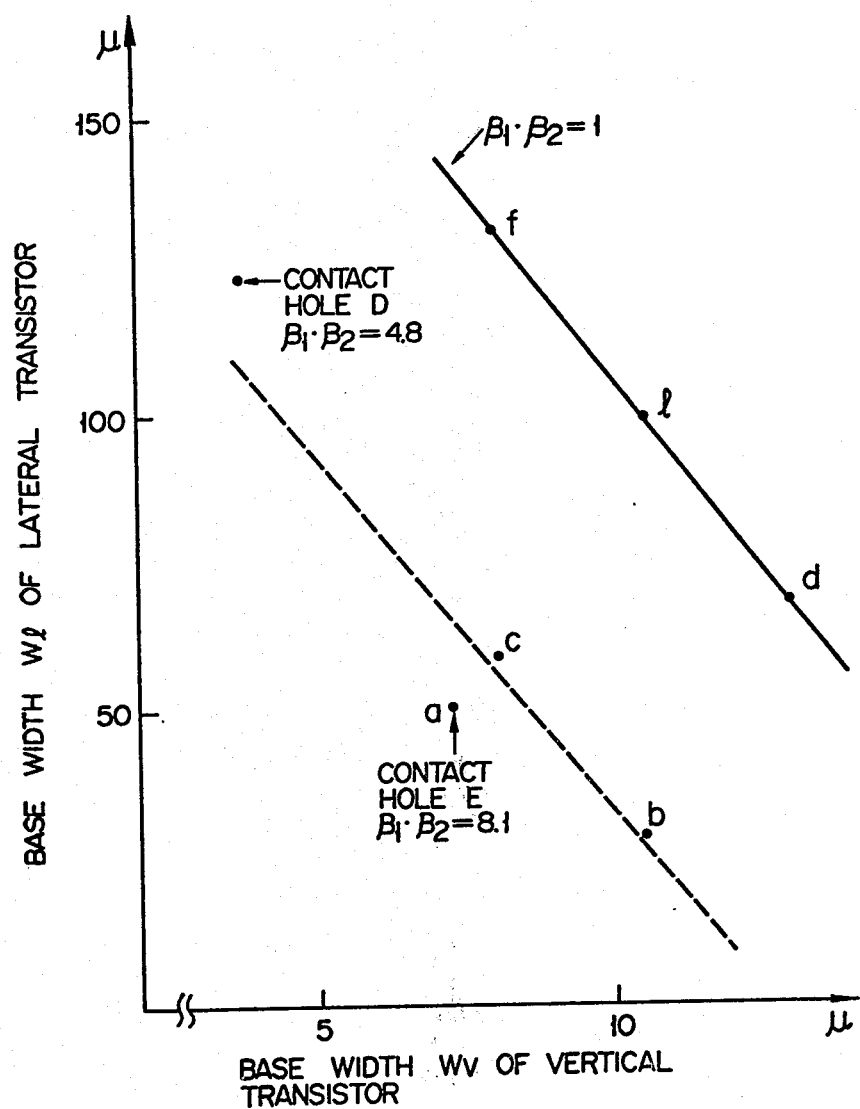
FIG. 6 is a diagram showing the dependence of the region where a latch up occurs on the base widths of both a parasitic lateral transistor and a parasitic vertical transistor and the location of a contact hole.

In the diagram of FIG. 6, plotted on the axis of abscissa is the base width $W_v$ of the vertical transistor $Tr_2$, and plotted on the axis of ordinate is the base width $W_l$ of the lateral transistor $Tr_1$. In this embodiment, the P well layer was formed by diffusing, for example, boron into the semiconductor substrate. Its thickness was $12.5\mu$ when the wafer slumping was conducted for 60 hours at 1200° C., $10.2\mu$ when the wafer-slumping was conducted for 40 hours at the same temperature, and $7.2\mu$ when the wafer-slumping was conducted for 20 hours at the same temperature. The product of the current amplification factors $\beta_1$ and $\beta_2$ was 8.1 in a CMOS inverter circuit wherein the base widths $W_l$ and $W_v$ of the lateral and vertical transistors $Tr_1$ and $Tr_2$ were of such values as denoted at point (a) in FIG. 6. It was 4.8 in a CMOS inverter circuit in which the base widths $W_l$ and $W_v$ were of such values as denoted at points (b) and (c) and 1.0 in a CMOS inverter circuit in which the base widths $W_l$ and $W_v$ were valued at points (d), (e) and (f), respectively. Any CMOS inverter circuit, wherein the base widths $W_l$ and $W_v$ have such values as denoted at a point located above the straight line on which points (d), (e) and (f) are aligned, had the product $\beta_1$ and $\beta_2$ smaller than 1. Thus no abnormal large current was observed to flow in such CMOS inverter circuit. By contrast, an abnormal current was observed to flow in the CMOS inverter circuits in which the base widths $W_l$ and $W_v$ of the lateral and vertical transistors $Tr_1$ and $Tr_2$ were at a point below said straight boundary line in FIG. 6. That is, the so-called "latch up" phenomenon was seen in these CMOS inverter circuits.

Further based on the above-mentioned consideration, the present inventors have discovered that occurrence and sustenance of abnormal current can be suppressed even when product of the current amplification factors $\beta_1$, $\beta_2$ is larger than 1, namely, when the base widths $W_l$, $W_v$ of the bipolar transistors are so narrow as to lie below a solid line of FIG. 6 denoting $\beta_1\beta_2=1$. In other words, the present inventors have found that occurrence or nonoccurrence of abnormal current depends on the area and position of a contact hole formed in the surface of a contact region to connect the semiconductor substrate and well layer to a power source.

With the CMOS inverter circuit of FIG. 2, a power source $V_{DD}$ is connected to an N type semiconductor substrate 1 at the same potential through an N+ contact region 9. A power source $V_{SS}$ (GND) is connected to a P well region 2 at the same potential through a P+ contact region 6. The N+ and P+ contact regions 9, 6 are required for an ohmic contact between the power sources $V_{DD}$, $V_{SS}$ and the substrate, P well layer respectively.

Where the CMOS circuit is supplied with a trigger signal by an external noise, current never flows across the power sources $V_{DD}$, $V_{SS}$ through the N type substrate 1 and P well layer 2 before a parasitic bipolar transistor constituting part of a thyristor circuit of FIG. 3 is operated in the N type substrate 1 or P well layer 2. Only where a potential difference defined by the product of the current and the resistance of the N type semiconductor substrate 1 or P well layer 2 that is, a level of voltage impressed across the base and emitter of a bipolar transistor reaches a sufficiently high level for operation of the bipolar transistor, i.e. a threshold voltage level between the base and emitter of the bipolar transistor, then the parasitic bipolar transistor whose base is formed of the N type semiconductor substrate 1 or P well layer 2 is put into operation to form a thyristor circuit connection shown in FIG. 3. Even if a noise signal is supplied to the CMOS circuit and unless voltage defined by the product arrived at by multiplying the current passing across the power sources $V_{DD}$, $V_{SS}$ by the resistance $R_{Nsub}$ of the N type semiconductor substrate 1 or the resistance $R_{Pwell}$ of the P well layer 2 reaches the level of the threshold voltage across the base and emitter of the bipolar transistor, the bipolar transistor is not actuated and thus the thyristor circuit is not operated, resulting in that abnormal current is little likely to arise in a sustained state, though some amount of current may momentarily flow through the CMOS circuit. Where, therefore, an amount of current initially flowing between the power sources $V_{DD}$, $V_{SS}$ upon the supply of a noise impulse signal is supposed to be constant, then it is necessary to decrease the resistance $R_{Nsub}$ of the N substrate or $R_{Pwell}$ of the P well in order to reduce a potential difference between both terminals of said resistance $R_{Nsub}$ or $R_{Pwell}$ itself to a lower level than that of the threshold voltage across the base and emitter of the bipolar transistor, thereby suppressing the sustained flow of abnormal current.

The resistance $R_{Nsub}$ and $R_{Pwell}$ has a maximum value over a path extending from the contact holes formed in the surface of the N+ contact region 9 and P+ contact region 6 to the boundary edge between the P well layer 2 and the N type substrate 1. To minimize the resistance $R_{Nsub}$, $R_{Pwell}$, therefore, it is advised to shorten, as prescribed, a distance from the edge of the contact hole of the N+ contact region 9 to the P well layer 2 and a distance from the edge of the contact hole of the P+ contact region 6 to the N type semiconductor substrate 1 or either of said two distances. To suppress the sustained flow of abnormal current, it is desired to shorten a distance between the edge of the contact hole of the N+ contact region 9 and/or P+ contact region 6 and the boundary edge between the P well layer 2 and the N type semiconductor substrate 1 in order to decrease the voltage occurring across the resistance $R_{Nsub}$ or $R_{Pwell}$, namely, the voltage applied across the base and emitter of the parasitic bipolar transistor whose base is constituted by the $P_{well}$ layer 2 or N type semiconductor substrate 1 to a lower level than that of the threshold voltage across the base and emitter of the bipolar transistor.

Figure 7:
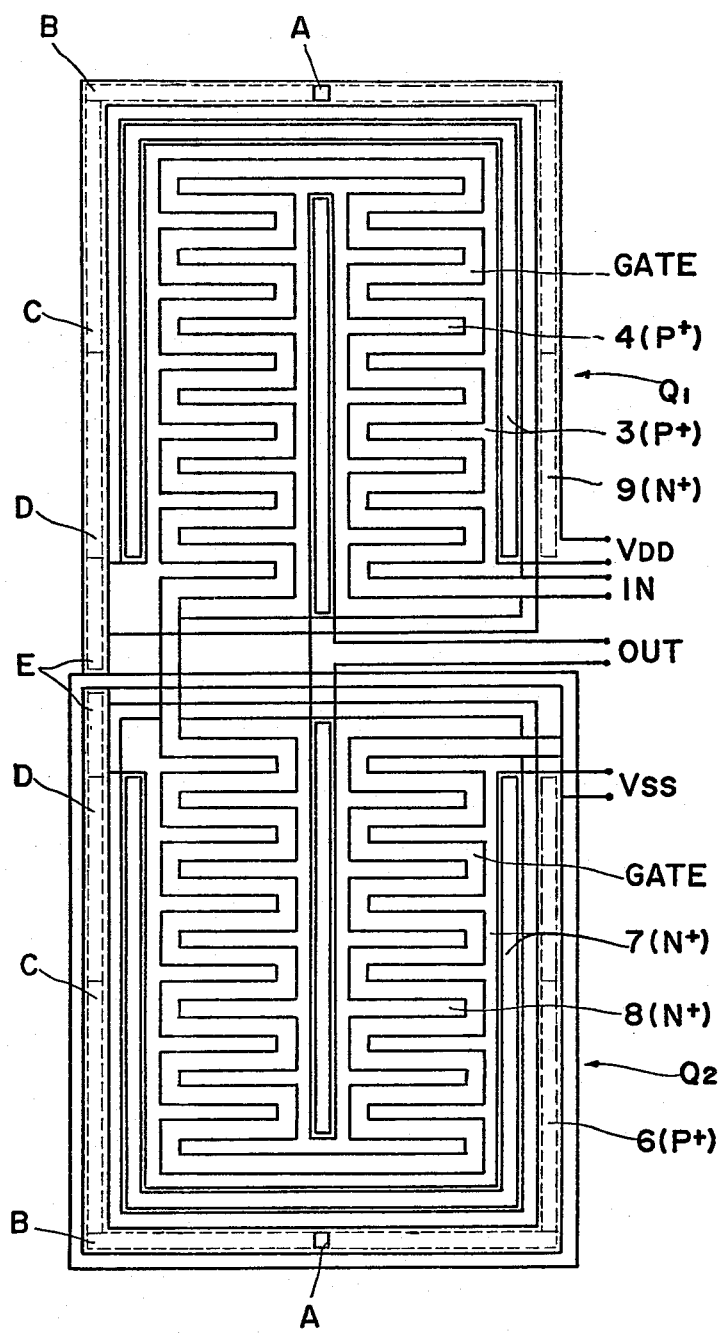
FIG. 7 is a plan view showing a pattern layout of the semiconductor device according to the present invention to show a location of a contact hole.

FIG. 7 presents the pattern layout of a CMOS circuit. The portions of said circuit corresponding to the respective regions of the semiconductor substrate of FIG. 2 are denoted by the same numerals as those of FIG. 2, description thereof being omitted.

The locations and areas of contact holes A, B, C, D, E are shown in FIG. 7 and Table 1 below.

Table 1

| Location of contact hole | Extension of contact hole | How contact hole is spaced from semiconductor substrate or well layer | Area | Contact resistance ($\Omega$) |
|---|---|---|---|---|
| A | Center of one crosswise edge | Remotest | 65 $\mu^2$ | 58 |
| B | Extending fully along said one crosswise edge up to two side edges disposed at right angles to said one crosswise edge | Remote | 2,700 $\mu^2$ | <5 |
| C | Extending fullly along said one crosswise edge and halfway of each of said two side edges disposed at right angles to said one crosswise edge | Slightly near | 6,787 $\mu^2$ | <5 |
| D | Extending fully along said one crosswise edge and three quarters of the total length of said two side edges disposed at right angles to said one crosswise edge | Near | 9,440 $\mu^2$ | <5 |
| E | Extending fully along said one crosswise edge and substantially the whole length of said two side edges disposed at right angles to said one crosswise edge | Nearest | 10,000 $\mu^2$ | <5 |

Figure 8:
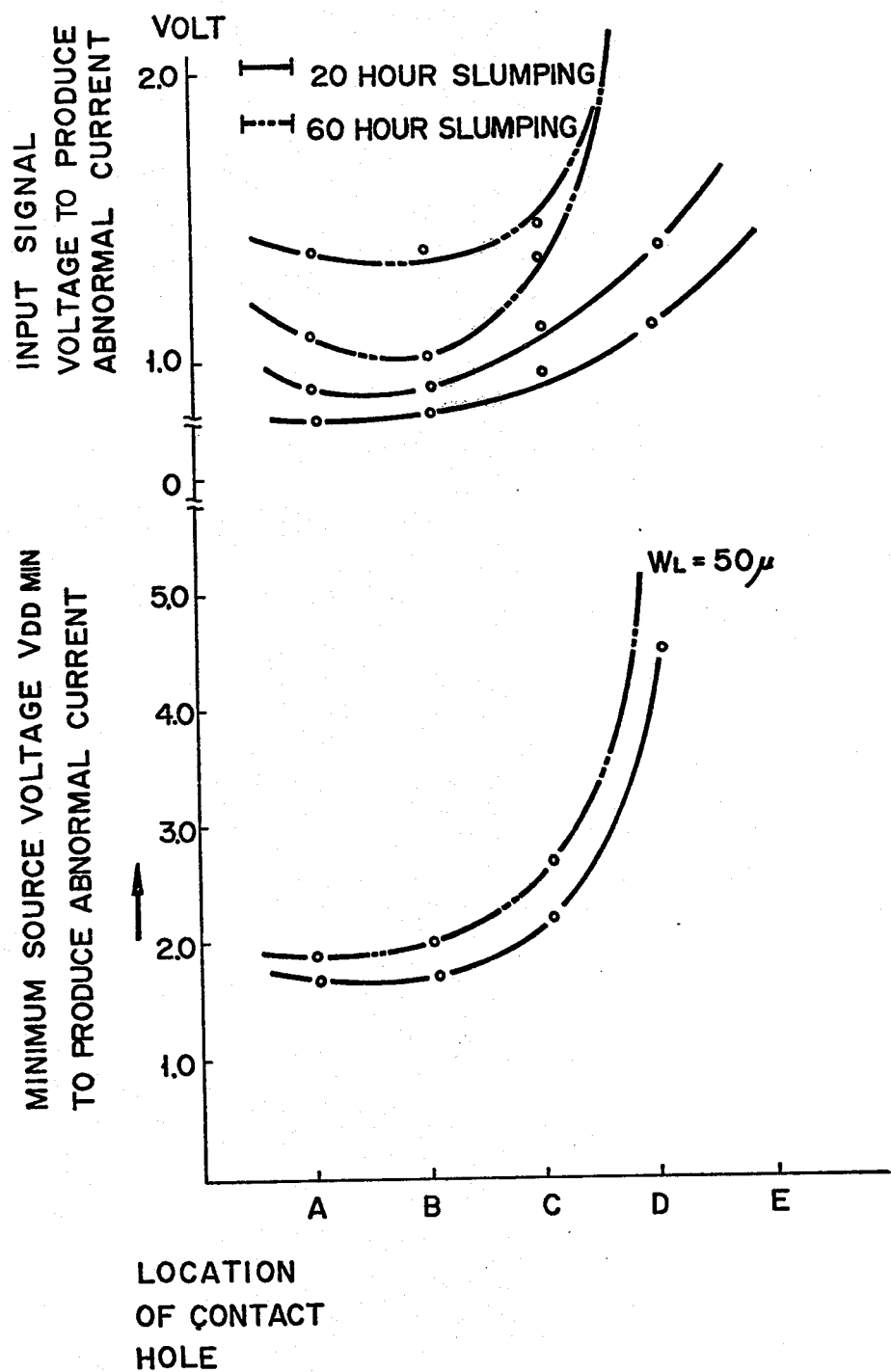
FIG. 8 is a diagram showing the relationship between a location of a contact hole and a minimum source voltage and input signal voltage to produce an abnormal current.

As seen from FIG. 7 and Table 1 above, the contact holes A to E formed on one of the MOS transistors $Q_1$, $Q_2$ progressively approach the N type semiconductor substrate 1 or P well layer 2 which constitutes the other of the MOS transistors $Q_1$ and $Q_2$ in the order of A to E with the resultant decrease in the resistivity of the resistance $R_{Nsub}$, $R_{Pwell}$. Further, since the contact holes A to E are successively increased in area in the order mentioned, the contact resistances of said holes A to E become smaller similarly in succession. Therefore, abnormal current arises with greater difficulty, as expected in the order of the contact holes A to E. The results of experiments carried out in this connection are set forth in FIG. 8. In FIG. 8, the positions of the contact holes are shown on the abscissa, and input signal voltage and minimum levels $V_{DD\ MIN}$ of power source voltage to produce abnormal current are plotted on the ordinate. Where an abnormal input signal having a maximum amount of current of 500 mA was applied to the CMOS circuit as the result of an external noise, it was proved that said abnormal current occurred with progressively greater difficulty in the order of the contact holes A to E. It was further disposed that a minimum level $V_{DD\ MIN}$ power source voltage causing the generation of abnormal current depended on the manner in which the contact holes were formed, and progressively increased in the order in which a value obtained by adding the resistance $R_{Nsub}$, $R_{Pwell}$ to a contact resistance successively became smaller, that is, in the order of the contact holes A to E. It was also found that where, with the product of the current amplification factors $\beta_1$, $\beta_2$ of both transistors taken to be $\geq 1$, it was tried to decrease the current amplification factor $\beta_2$ of the vertical transistor $Tr_2$ by providing a P well layer with a layer depth $x_j$ in forming the contact holes A, B, C, it was still impossible to suppress abnormal current, but that where the contact holes were formed in the same manner as in the case of the contact holes D, E, the formation of the P well with a greater depth was effective to eliminate the occurrence of abnormal current. A solid line, one dot-chain line and two dots-chain line of FIG. 8, as in FIG. 5, respectively denote slumping times of 20 hr, 40 hr and 60 hr used in manufacturing a semiconductor wafer. It is seen from FIG. 8 that with the contact holes A, B, C formed as described in connection with FIG. 7, abnormal current appeared regardless of the slumping time, when the product of the current amplification factors $\beta_1$, $\beta_2$ of the bipolar transistors was indicated $\geq 1$; with the contact hole D, abnormal current arose in a semiconductor device prepared by slumping of 20 hr, when the base width $W_l$ of a lateral transistor $Tr_1$ was chosen to be 50 microns and no abnormal current took place in a semiconductor device manufactured by slumping of 60 hr.

Figure 9:
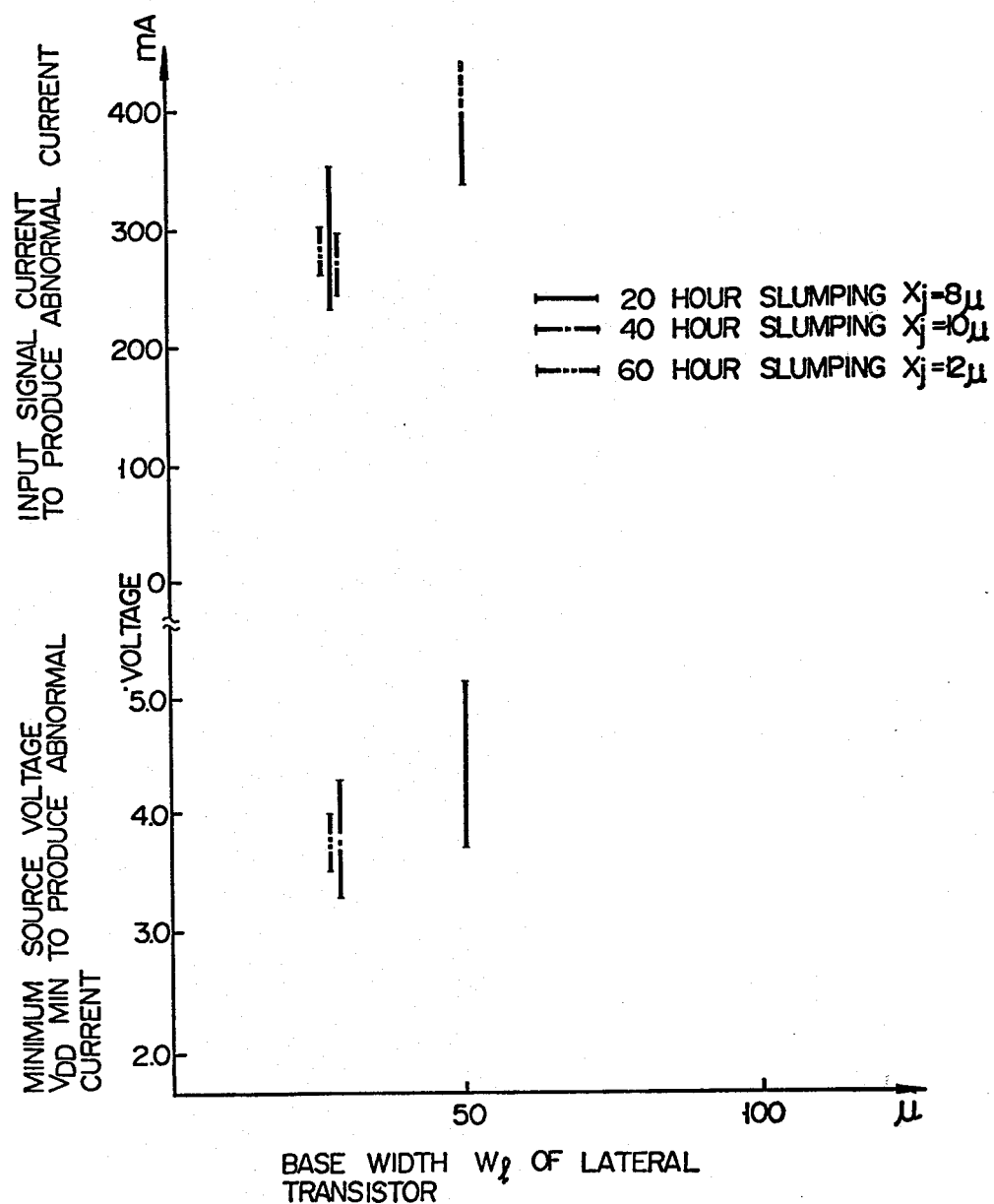
FIG. 9 is a diagram showing the relationship between a base width of a lateral transistor having an N substrate as its base and a minimum source voltage and input signal voltage to produce an abnormal current.

Referring to FIG. 9, the base width of a lateral transistor $Tr_1$ is shown on the abscissa, and an amount of input signal current and a minimum level $V_{DD\ MIN}$ of power source voltage to produce abnormal current are plotted on the ordinate.

FIG. 9 shows the occurrence or nonoccurrence abnormal current in the contact hole D with the base width of a lateral transistor $Tr_1$ varied. With the base width $W_l$ of the lateral transistor taken to be 70 microns, no abnormal current occurs, whereas, in case of $W_l$ of 30 microns, abnormal current actually arises. With $W_l$ taken to be 50 microns, abnormal current is or is not produced according to the kind of semiconductor wafer itself or length of slumping time. With the contact hole D, therefore, a critical condition for the emergence of abnormal current is supposed to be that the base width $W_l$ of the lateral transistor is 50 microns. FIG. 9 shows that with $W_l$ taken to be 50 microns, and slumping time to be 20 hr or the depth $x_j$ of the P well layer to be 8 microns, abnormal current is or is not generated according to the kind of semiconductor wafer. Therefore, slumping time of 20 hr is considered necessary. The base of a vertical transistor $Tr_2$ has a width $W_v$ of 5.24 microns in the case of 20 hr-slumping. With $W_l$ taken to be 50 microns and $W_v$ to be 5.24 microns, a product of current amplification factors $\beta_1$, $\beta_2$ determined from FIGS. 4 and 5 is expressed as $2.0 \times 10^2 \times 2.4 \times 10^{-2} = 4.8$. Therefore, it is seen in FIG. 6 that with the contact hole D, a boundary region determining the occurrence or no occurrence of abnormal current lies at a point at which a product of the current amplification factors $\beta_1$, $\beta_2$ of the bipolar transistors indicates 4.8. This means that with the contact hole D, abnormal current can be suppressed even in the region where the product of $\beta_1$, $\beta_2$ is larger than 1.

Further experiments show that with the contact hole E, a region where a product of the amplification factors $\beta_1$, $\beta_2$ of the bipolar transistors indicates 8.1 as shown in FIG. 6 constitutes a boundary determining the presence or absence of abnormal current. When formation of a contact hole proceeds from D to E, a distance between the contact hole and the semiconductor substrate or well layer is more shortened, with the resultant increase in the area of that portion of the $W_l$, $W_v$ where no abnormal current is generated, thereby enabling a CMOS semiconductor device presenting a larger product of amplification factors to be saved from abnormal current. Namely, depending on the manner in which a contact hole is formed, it is possible to prevent the occurrence of abnormal current even in the case where a product of the amplification factors $\beta_1$, $\beta_2$ of the bipolar transistors is larger than 1.

The following experimental formula has been obtained to express the relationship between a current amplification factor and the base width of the parasitic transistor:

$$\text{Current amplification factor } \beta = K\exp(-aW) \qquad (10)$$

where:

K, a = coefficients
W = base width of a parasitic bipolar transistor

Further, the present inventors have adopted a parameter $\delta$ associated with the manner in which a contact hole is formed, thereby experimentally establishing the following formula showing the relationship between the base width $W_l$ of a lateral transistor $Tr_1$ and the base width $W_v$ of a vertical transistor $Tr_2$ which cooperate to suppress abnormal current.

$$W_l > \frac{1}{m} \log \frac{K_l K_v}{\delta} - \frac{n}{m} W_v \qquad (11)$$

Where:
$K_l$, $K_v$ = values of a coefficient K of the formula (10) in the lateral and vertical transistors $Tr_1$ and $Tr_2$
m, n = values of a coefficient a of the formula (10) in the lateral and vertical transistors $Tr_1$ and $Tr_2$ There will now be described the above-mentioned formula (11) by reference to FIG. 6. The base width $W_l$ of the lateral transistor $Tr_1$ is plotted on the ordinate, and the base width $W_v$ of the vertical transistor $Tr_2$ is shown on the abscissa. The formula (11) denotes a region lying above a straight line whose contact with the ordinate (not shown in FIG. 6) is expressed as $1/m \log K_l K_v/\delta$. Change of the location of a contact hole or the manner in which a contact hole is formed leads to variation of $\delta$. Where, therefore, formation of a contact hole is shifted from A to E, then the line of the formula (11) denoting the boundary region of the occurrence of abnormal current is shifted downwards in parallel with a line representing a product of the current amplification factors $\beta_1$, $\beta_2 = 1$ to enlarge a region lying above a line satisfying the formula 11, namely, a region enabling the lateral and vertical transistors to have a base width adapted to suppress abnormal current.

Where, therefore, a contact hole is so formed as to satisfy $\delta$ given in the above-mentioned formula (11), then the operation of a parasitic bipolar transistor in which a product of current amplification factors is larger than 1 can be so controlled as to suppress abnormal current.

As mentioned above, abnormal current can be suppressed by defining a distance from the edge of a contact hole being formed in the N+ contact region of the P channel MOS transistor to the collector of the lateral transistor Tr₁ or P well layer, and a distance from the P+ contact region of the N channel MOS transistor to the collector of the vertical transistor Tr₂ or the N type semiconductor substrate or either of said distances so as to cause a potential difference occurring at both terminals of the resistance $R_{Nsub}$ and resistance $R_{Pwell}$ respectively to fall below the level of threshold voltage across the base and emitter of the lateral transistors Tr₁, Tr₃ and also the level of threshold voltage across the base and emitter of the vertical transistors Tr₂, Tr₄. In this case, the threshold voltage is chosen to be about 0.5 volt.

Further, where the P+ source region 3 of the P channel MOS transistor is made to have the same potential as the N type semiconductor substrate 1, then voltage applied across the emitter and base of a parasitic lateral bipolar transistor whose base is constituted by the N type semiconductor substrate 1 is reduced to zero, and never rises above the threshold voltage $V_{th}$ across said emitter and base, thereby suppressing the operation of said parasitic lateral bipolar transistor. As the result, the thyristor circuit of FIG. 3 is not formed, saving the CMOS semiconductor device from the occurrence of abnormal current. Similarly, where the N+ source region 7 of the N channel MOS transistor is made to have the same potential as the P well layer 2, then voltage applied across the emitter and base of a parasitic lateral bipolar transistor whose base is constituted by the P well layer 2 falls to zero and never exceeds the threshold voltage across said emitter and base, thereby suppressing the operation of said parasitic lateral bipolar transistor. As the result, no abnormal current appears in the CMOS semiconductor device. Elimination of abnormal current is attained even in the case where a product of the amplification factor $\beta_1$ of the lateral transistor Tr₁ and the amplification factor $\beta_2$ of the vertical transistor Tr₂ is $\geq 1$.

Figure 10:
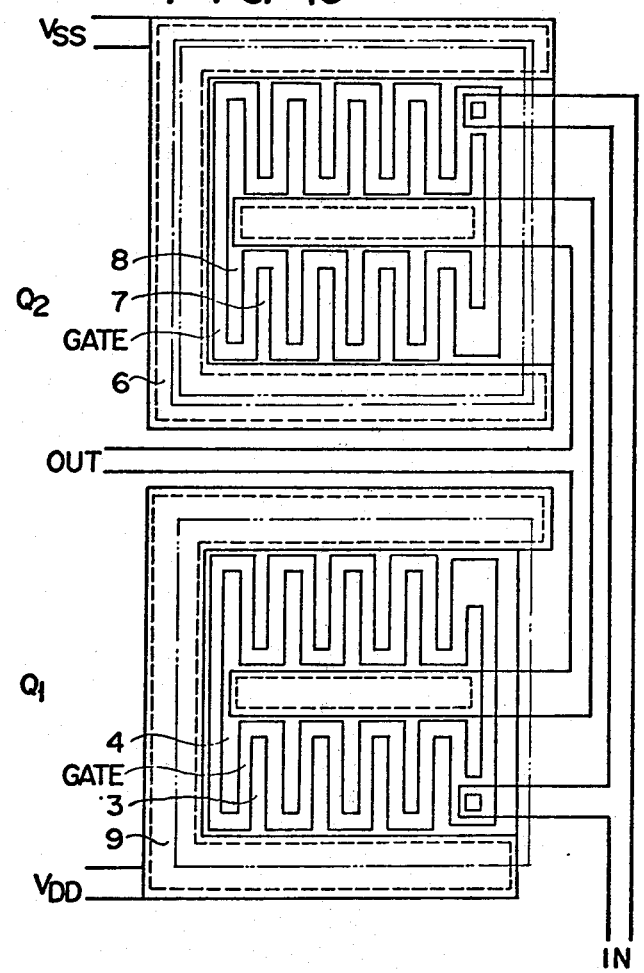
FIGS. 10 and 11 are plan views showing various pattern layouts of the semiconductor device of this invention.
Figure 11:
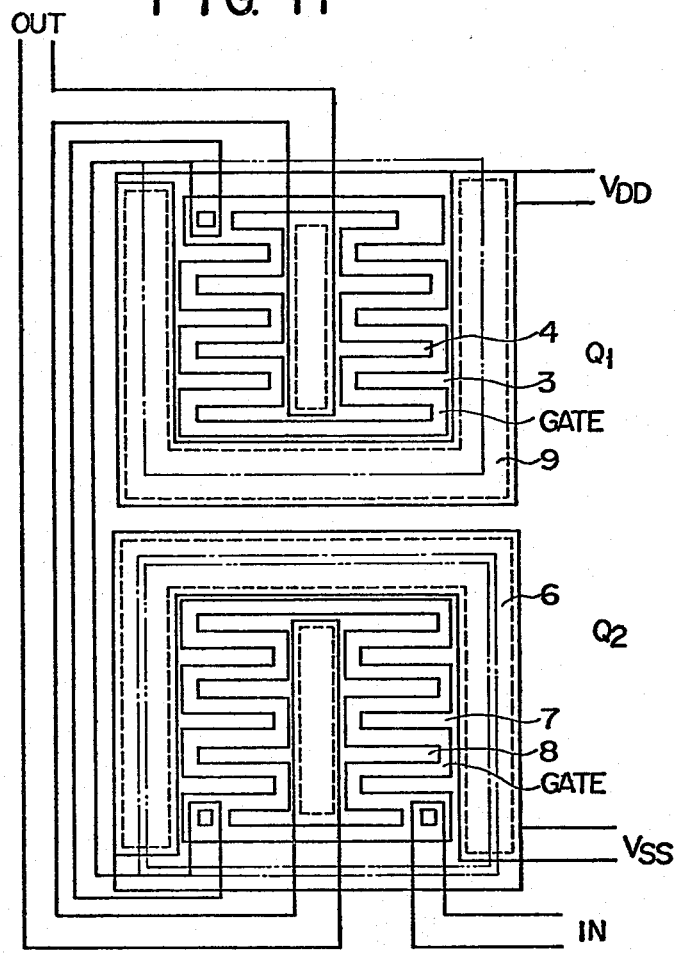

In order that the P+ source region 3 is made to have the same potential as the N type semiconductor substrate 1, the N+ coupling region 9 is connected in common to the P+ source region 3 and to power source $V_{DD}$ and further a contact hole is formed in silicon oxide film 10 to expose said N+ coupling region 9 and source region 3. The contact hole and coupling region 9 may be formed to surround, as shown by the pattern of FIGS. 10 and 11, the source, gate and drain of the P channel MOS transistor over the entire surface of the N type semiconductor substrate 1. A contact electrode of conductive film, for example aluminum, is deposited over the contact hole and cut to form a means for connecting coupling region 9 and source region 3 to power source $V_{DD}$.

Similarly, in order that the N+ source region 7 is made to have the same potential as the P well layer 2, the P+ coupling region 6 is connected in common to the N+ source region 7 and to power source $V_{SS}$ and a contact hole is formed in silicon oxide film 10 to expose said P+ coupling region 6 and source region 7. The contact hole and coupling region 6 may be formed to surround, as shown by the pattern of FIGS. 10 and 11, the source, gate and drain of the N channel MOS transistor over the entire surface of the P well layer. A contact electrode of conductive film, for example aluminum, is deposited over the contact hole and cut to form a means for connecting coupling region 6 and source region 7 to power source $V_{SS}$. The parts of FIGS. 10 and 11 the same as those of FIGS. 2 and 7 are denoted by the same numerals, and description of the pattern of FIGS. 10 and 11 are omitted. The means for making the P+ source region 3 of the P channel MOS transistor have the same potential as the N type semiconductor substrate 1, and the means for making the N+ source region 7 of the N channel MOS transistor have the same potential as the P well layer 2 may be adopted at the same time, or only one of these processes may be effected.

Further, the above-mentioned means for making the respective source regions have the same potential as the corresponding semiconductor substrate and P well layer may be accompanied with the means for controlling a distance between the respective contact holes and the corresponding semiconductor substrate and P well layer.

This invention is applicable not only to the CMOS inverter circuit, but also many other forms of CMOS circuit including a thyristor circuit. Obviously, the CMOS may be formed by providing an N well layer in the P type semiconductor substrate.

What we claim is :

1. In a CMOS semiconductor device comprising a first region of one conductivity type, a second region of the opposite conductivity type formed in the first region, a first MOS transistor of one channel type having a first source, first drain, and first gate and formed in the first region, a second MOS transistor of the opposite channel type having a second source, second drain, and second gate and formed in the second region, and, in the presence of impulse noise, said semiconductor device resulting in at least one first parasitic bipolar transistor comprising one of said first drain and source and first region and said second region, and at least one second parasitic bipolar transistor comprising one of said second drain and source, said first region and said second region, the improvement to said semiconductor device comprising means for suppressing the operation of at least one of said parasitic transistors, by setting at least one of said first and second sources of said first and second MOS transistors to have the same potential as said region in which said respective first and second source is formed, said means for suppressing including:
a first coupling region formed contiguous to one of said first and second sources;
an insulating layer covering said first coupling region and said one of said first and second sources;
a first contact hole formed in said insulating layer to expose said first coupling region and said one of said first and second sources; and
a first contact electrode of conductive film located in said first contact hole and cut to form means for connecting said first coupling region and said one of said first and second sources to a common source of potential, said first coupling region and said first contact hole formed to surround said one of said first and second sources.

2. A CMOS semiconductor device according to claim 1 wherein a product of a current amplification factor of said at least one first parasitic bipolar transistor whose base is formed of said first region and a current amplification factor of said at least one second parasitic bipolar transistor whose base is formed of said second region is more than 1.

3. A CMOS semiconductor device according to claim 1 wherein a product of a current amplification factor of a parasitic bipolar transistor whose base is formed of said first region and a current amplification factor of a parasitic bipolar transistor whose base is formed of said second region is more than 1.

4. A device according to claim 1 wherein said means for suppressing also includes a second coupling region formed contiguous to the other of said first and second sources;

said insulating layer further covering said second coupling region and said other of said first and second sources;

a second contact hole formed in said insulating layer to expose said second coupling region and said other of said first and second sources; and a second contact electrode of said conductive film located in said second contact hole and cut to form means for connecting said second coupling region and said other of said first and second sources to another common source of potential, said second coupling region and said second contact hole formed to surround said other of said first and second sources.

* * * * *